US007632351B2

(12) United States Patent
Thompson

(10) Patent No.: US 7,632,351 B2
(45) Date of Patent: *Dec. 15, 2009

(54) ATOMIC LAYER DEPOSITION PROCESSES FOR THE FORMATION OF RUTHENIUM FILMS, AND RUTHENIUM PRECURSORS USEFUL IN SUCH PROCESSES

(75) Inventor: Jeffery Scott Thompson, West Chester, PA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 343 days.

This patent is subject to a terminal disclaimer.

(21) Appl. No.: 11/497,858

(22) Filed: Aug. 1, 2006

(65) Prior Publication Data

US 2007/0037392 A1 Feb. 15, 2007

Related U.S. Application Data

(60) Provisional application No. 60/706,493, filed on Aug. 8, 2005.

(51) Int. Cl.
*C30B 25/00* (2006.01)
*C23C 16/18* (2006.01)

(52) U.S. Cl. .................. 117/88; 117/104; 427/124; 427/250; 438/681

(58) Field of Classification Search ................ 438/681; 427/124, 126.5, 250; 117/88, 104
See application file for complete search history.

(56) References Cited

U.S. PATENT DOCUMENTS

| | | | | | |
|---|---|---|---|---|---|
| 3,997,337 | A | * | 12/1976 | Pittie et al. | ..................... 423/22 |
| 6,208,003 | B1 | * | 3/2001 | Miura | ......................... 257/412 |
| 6,458,183 | B1 | * | 10/2002 | Phillips et al. | ................ 75/631 |
| 6,824,816 | B2 | * | 11/2004 | Aaltonen et al. | ............ 427/124 |
| 6,875,518 | B2 | * | 4/2005 | Shiho et al. | ................. 428/457 |
| 6,939,578 | B2 | * | 9/2005 | Bradley et al. | .............. 427/252 |
| 7,220,451 | B2 | * | 5/2007 | Aaltonen et al. | ....... 427/255.29 |
| 7,309,658 | B2 | * | 12/2007 | Lazovsky et al. | ........... 438/754 |
| 2002/0102818 | A1 | | 8/2002 | Sandhu et al. | |
| 2004/0105934 | A1 | | 6/2004 | Chang et al. | |
| 2005/0085031 | A1 | * | 4/2005 | Lopatin et al. | .............. 438/222 |
| 2005/0107283 | A1 | * | 5/2005 | Bradley et al. | .............. 510/446 |
| 2007/0054487 | A1 | * | 3/2007 | Ma et al. | ..................... 438/681 |
| 2007/0077750 | A1 | * | 4/2007 | Ma et al. | ..................... 438/618 |
| 2007/0293040 | A1 | * | 12/2007 | Emesh et al. | ............... 438/627 |
| 2008/0274369 | A1 | * | 11/2008 | Lee et al. | ..................... 428/639 |

FOREIGN PATENT DOCUMENTS

WO    WO 2004/035858 A2    4/2004

OTHER PUBLICATIONS

Aaltonen, Titta, et al., "Ruthenium thin films grown by atomic layer deposition." Chemical Vapor Deposition, vol. 9 No. 1 2003, pp. 45-49. Abstract Only.*
Kwon, Oh-Kyum, et al., "Plasma-Enhanced Atomic Layer Deposition of Ruthenium Thin Films." Electrochemical and Solid-State Letters, 7 (4), C46-C48 (2004).*
Dharmaraj, Nallasamy, et al., "Ruthenium(II) carbonyl complexes containing tetradentate Schiff bases". Transition Met. Chem., 23, pp. 129-132 (1998).*
Benabdellah, M., et al., "Ruthenium-ligand complex, an efficient inhibitor of steel corrosion in H3PO4 media". Materials Letters 61 (2007), pp. 1197-1204.*
M. Ritala et. al., Atomic Layer Deposition in Handbook of Thin Film Materials, 2001, vol. 1, Chapter 2, Academic Press.
International Search Report Dated Nov. 8, 2006, International Application No. PCT/US2006/030712, International Filing Date: Aug. 7, 2006.

* cited by examiner

*Primary Examiner*—Bret Chen

(57) ABSTRACT

This invention is directed to processes for the formation of ruthenium-containing films on surfaces in atomic layer deposition (ALD) processes. The ALD process includes depositing a surface-activating group on the surface; exposing the deposit of the surface-activating complex to a ruthenium precursor to form a deposited ruthenium complex on the surface; and reacting the deposited ruthenium complex with a reducing agent to form a ruthenium-containing film on the surface. This invention is also directed to ruthenium complexes, $RuL_2L^*$, that can be used as ruthenium precursors in these processes.

10 Claims, No Drawings

//ATOMIC LAYER DEPOSITION PROCESSES FOR THE FORMATION OF RUTHENIUM FILMS, AND RUTHENIUM PRECURSORS USEFUL IN SUCH PROCESSES

FIELD OF THE INVENTION

This invention relates to processes for the formation of ruthenium-containing films on surfaces in atomic layer deposition (ALD) processes using surface-activating agents, and to ruthenium complexes that can be used as ruthenium precursors in these processes.

BACKGROUND

Atomic layer deposition (ALD), also known as atomic layer epitaxy, is a process for depositing highly uniform and conformal thin layers of a metal on a surface. The surface is exposed to vapors of the metal precursor and a reducing agent. Such films have a wide variety of applications in semiconductor microelectronics and optical films. The conventional ALD process, which uses a two-step procedure, is described by M. Ritala and M. Leskela in "Atomic Layer Deposition" in Handbook of Thin Film Materials, H. S. Nalwa, Editor, Academic Press, San Diego, 2001, Volume 1, Chapter 2.

In a typical two-step ALD process, there is a self-limiting adsorption of the metal complex to the surface that is controlled by the interaction of the precursor with the substrate in a thermal degradation step. The loss of the ligand is induced thermally, as the metal surface has no functional groups to induce ligand loss chemically. The metal precursor is desirably stable enough to be transferred into the reaction chamber, and reactive enough to undergo a transformation at the substrate surface.

In a related ALD process, the substrate contains functional groups that react chemically with at least one ligand on the metal-containing precursor. For example, a typical process used to prepare thin, conformal $Al_2O_3$ films uses a substrate with hydroxyl groups. The substrate is contacted with $Al(CH_3)_3$, which reacts with the surface hydroxyl groups to form an adsorbed Al—O complex and liberated methane. When the surface hydroxyl groups are consumed, the reaction stops. Water is then contacted with the Al—O complex on the surface to generate an aluminum oxide phase and additional hydroxyl groups. The process is then repeated as needed to grow an oxide film of desired thickness. The deposition rate of the $Al(CH_3)_3$ is controlled by the number of surface hydroxyl groups. Once the hydroxyl groups are consumed, no additional $Al(CH_3)_3$ can be adsorbed to the surface.

In other known ALD processes for the deposition of metal films on substrates of interest, there may be no reactive group on the substrate surface to initiate the type of self-limiting reaction that is seen in the $Al_2O_3$ case. For example, in the deposition of a metal barrier layer on a tantalum nitride substrate, the self-limiting adsorption is achieved through the thermal decomposition of the precursor. Therefore, the precursor is preferably designed to have the volatility and stability needed for transport to the reaction chamber, but also the reactivity to undergo clean thermal decomposition to allow a metal complex to chemisorb to the substrate surface. Often, these processes produce films contaminated with fragments from the metal ligands degraded during the thermal deposition.

In an ALD process for depositing ruthenium films, the substrate in a reaction chamber is exposed sequentially to a ruthenium precursor and a reducing agent or an oxidizing agent introduced alternatively. The substrate is exposed to the first reactant, which is a ruthenium precursor that is chemisorbed onto the surface of the substrate. Excess reactant is removed by purging the reaction chamber. This process is followed by the exposure of the chemisorbed complex on the substrate to the second reactant, usually a reducing agent, which reacts with the metal complex to produce the ruthenium film. The second reagent removes the organic ligand from the metal precursor and reduces the metal ion to its elemental state. The reaction chamber is again purged to remove excess reducing agent. The cycle can be repeated, if needed, to achieve the desired film thickness. (U.S. Pat. No. 6,617,248 and WO2004/035858)

U.S. Pat. No. 6,824,816 has disclosed the atomic layer deposition of ruthenium from ruthenium precursors such as bis(cyclopentadienyl)ruthenium, bis(ethylcyclopentadienyl)ruthenium, tris(2,4-octanedionato)ruthenium, tris(2,2,6,6-tetramethyl-3,5-heptanedionate)ruthenium, and bis(pentamethylcyclopentadienyl)ruthenium. In this process, the precursor is deposited as no more than a single monolayer on a substrate surface, and then the deposited precursor is reacted with a second reactant gas comprising oxygen to give a Ru metal layer. The sequence of deposition and reaction steps can be repeated to provide thicker metal layers. The growth temperature of the metal thin film is approximately 200-500° C., preferably 300-360° C. One disadvantage of the process is that oxygen is not compatible with some barrier layers that are used in the manufacture of electronic devices. Another disadvantage is that the deposited Ru metal film may contain unacceptably high levels of contaminants derived from the oxidation of the precursor ligands.

US 2004/0092096 discloses a method for improving the adhesion between a diffusion barrier film and a metal film, by creating a monolayer of oxygen atoms between the diffusion barrier film and the metal film. Suitable metals include Cu, Al, Ni, Co and Ru. In one embodiment, the monolayer is created by exposing the diffusion barrier film to an oxygen-containing reactant and then depositing the metal film via CVD, ALD, PVD or sputtering.

There is a need for a process for the formation of oxide-free ruthenium-containing films that can be run at relatively low temperatures and that can provide high quality, uniform films of high purity. Such a process would allow the electronics industry to take advantage of the desirable properties of Ru, such as its ability to serve as a seed layer for copper electrodeposition and its ability to be patterned by etching.

SUMMARY OF THE INVENTION

One aspect of the present invention is a process for depositing an oxide-free ruthenium-containing film on a surface of a substrate, comprising:
  a. exposing the surface to a surface-activating agent to form a deposit of a surface-activating complex on the surface;
  b. exposing the deposit of the surface-activating complex to a ruthenium precursor to form a deposit of a ruthenium complex on the surface; and
  c. reacting the deposited ruthenium complex with a reducing agent to form an oxide-free ruthenium-containing film on the substrate surface.

Another aspect of the present invention is a process for depositing an oxide-free ruthenium-containing film on a surface of a substrate, comprising:
  a. exposing the surface of a substrate to a surface-activating agent to form a deposit of a surface-activating complex on the surface; and b. exposing the deposit of the surface-activating complex on the substrate to a ruthenium precursor and a reducing agent to form an oxide-free ruthenium-containing film on the surface.

Another aspect of the present invention includes ruthenium complexes that are useful as ruthenium precursors in processes for depositing a ruthenium-containing film on a substrate.

DETAILED DESCRIPTION

Applicant has discovered novel ALD processes for the deposition of oxide-free ruthenium-containing films. One aspect of this invention is a process comprising the sequential exposure of a substrate surface to three reagents: a surface-activating agent, a ruthenium precursor and a reducing agent.

The surface activating agent, the ligands on the ruthenium precursor and the reducing agent are chosen so that the products from the reduction reaction are readily removed from the reaction chamber. The self-limiting adsorption step relies on the specific reaction between a pre-adsorbed complex and the metal precursor, rather than the thermal degradation of a precursor. Compounds can thus be thermally stable and can be transported into the reaction chamber without degradation. The only reaction in the reaction chamber takes place at the surface with the adsorbed surface activating agent. The process allows the use of compounds that would not be suitable for an ALD process by a thermal degradation route.

The first step of a process according to one embodiment of the invention is the deposition on the substrate surface of a surface-activating agent that reacts with an incoming ruthenium precursor in a second step to form a nonvolatile surface-bound metal precursor complex on the surface in a self-limiting deposition reaction. The surface-bound complex is reacted with a reducing agent to generate the desired film. The process can be repeated as many times as necessary to attain the desired film thickness. In one embodiment, only a single application of the surface-activating agent is needed at the beginning of the deposition. In another embodiment, the surface-activating agent is introduced into the chamber before the ruthenium precursor on each cycle.

Another embodiment of the invention is a two-step process in which the deposited surface-activating agent is exposed to a mixture of the ruthenium precursor and the third reagent, with the proviso that that there is no gas-phase reaction between the ruthenium precursor and the third reagent. The two-step process can be repeated as many times as necessary to attain the desired film thickness.

Typically, these processes are conducted in a reaction chamber that can be evacuated, and into which controlled amounts of volatile reagents can be introduced. A means for heating the substrate is also useful.

Suitable substrates include conducting, semi-conducting and insulating substrates, including substrates which are typically used in the electronics industry to manufacture ultra large scale integrated circuits. Suitable substrates typically comprise copper, silicon, silicon dioxide, low k substrates, or low k substrates coated with a barrier layer. Suitable barrier layers include tantalum, tantalum nitride, titanium, titanium nitride, tantalum silicon nitride, titanium silicon nitride, tantalum carbon nitride, tungsten carbonitride, and niobium nitride. "Low k" substrates have a dielectric constant ("k") less than about 4. Suitable low k substrates include doped oxides (e.g., FSG, HSQ, MSQ, HOSP), organics (e.g., SiLK, BCB, FLARE, PAE), highly fluorinated materials (e.g., parylene-F, a-CF, and PTFE), and porous materials (e.g., aerogel and xerogel). Ultra large integrated circuits typically contain many millions of gates and hundreds of millions of individual transistors.

The first step in one embodiment of the present invention is the deposition of a surface-activating agent on the substrate. The surface activating agent is a proton donor that chemisorbs to the substrate. The surface-activating group can be an acid that can donate a proton to the ruthenium precursor to create a cationic complex which is no longer volatile and consequently chemisorbs to the surface. The conjugate base of the surface-activating agent is the counter ion to the newly formed cationic ruthenium complex.

Alternatively, the surface-activating group can add to a coordinated ligand, or displace a coordinated ligand from the metal coordination sphere to form a new complex. In the absence of the surface-activating agent, there is little or no adsorption of the ruthenium precursor to the surface.

The deposition of the surface-activating agent can be conducted at temperatures of 20° C. to 400° C., which is lower than the temperature of a typical thermal degradation, and thus avoids contamination of the final deposited metal film by ligands.

The surface-activating agent is chosen to produce a nonvolatile complex on the surface suitable for the next step of the ALD process, i.e., the deposition of the Ru precursor. The choice of surface-activating agent depends on the ligands coordinated to the ruthenium ion. The ruthenium precursor comprises a basic ligand, and the surface-activating agent should be acidic enough to protonate the coordinated ligand.

Suitable surface activation agents include imines, piperidines, nitrogen-containing aromatic heterocycles (e.g., pyrazoles, imidazoles and triazoles), water, and carboxylic acids such as formic acid and acetic acid. Suitable nitrogen-containing aromatic heterocycles include pyrazole, 3,5-dimethylpyrazole, 3,4,5-trimethylpyrazole, 1H-1,2,3-triazole, and 1,2,4-triazole. In some embodiments, oxygen-free surface-activating agents are desirable.

Preferably, excess (undeposited) surface-activating agent is evacuated from the reaction chamber before the ruthenium precursor is introduced.

A ruthenium precursor is then brought into contact with the adsorbed surface-activating complex to allow a reaction between the adsorbed complex and the Ru precursor. The reaction necessarily stops when the surface activating group is consumed. Excess precursor and by-products can be removed by evacuation or flushing of the reaction chamber.

The reducing agent is then brought into the reaction chamber. Typically, the reducing agent is introduced after any undeposited ruthenium precursor and by-products from the reaction of the Ru precursor with the surface activating group have been evacuated from the reaction chamber. Alternatively, the reducing reagent can be introduced along with the ruthenium precursor, provided there is no gas-phase reaction between the two. The reducing agent reacts with the deposited Ru precursor to form an oxide-free Ru film on the substrate surface.

In one embodiment of this invention, the reducing agent also regenerates the surface-activating agent.

In another embodiment of this invention, the reducing agent also reacts with the surface-activating agent to form volatile by-products that can be removed from the reaction chamber by evacuation or purging.

Suitable reducing reagents include hydrogen, silane, 9-BBN (9-borabicyclo[3.3.1]nonane), borane, dihydrobenzofuran, pyrazoline, diethylsilane, dimethylsilane, ethylsilane, methylsilane, and phenylsilane. Desirable reducing agents are volatile and do not decompose on heating. Also, it is desirable that the reducing agents be of sufficient reducing power to react rapidly on contact with the ruthenium precursor complex deposited on the substrate surface.

The deposition of the Ru precursor and the subsequent reaction with the reducing reagent can be carried out over a wide range of temperatures, typically room temperature to about 450° C., depending on the volatility of the precursor, the desired film and application. Processes using more volatile complexes can be run at lower temperatures. The deposition process of this invention improves upon the processes described in the art by allowing the use of lower temperatures and producing higher quality, more uniform films.

To be useful in an ALD process, the ruthenium precursor is desirably volatile enough to be sublimed or volatilized without significant thermal decomposition. The ligands used in the ALD processes are also desirably stable with respect to decomposition and able to desorb from the precursor in a metal-free form following reaction with the deposited surface-activating agent or a reducing agent. Following reduction of, or reaction of, the metal ion, any remaining ligand is liberated and removed from the surface to prevent its incorporation into the ruthenium-containing layer being formed. Evacuation after the third step may not be necessary. For example, with hydrogen as a reducing agent, it is generally not necessary to purge the chamber before introduction of the surface-activating agent.

It is not intended that the processes herein be limited to having three individual steps. For example, it is envisioned that one could use a two-step process with introduction of the surface-activating agent followed by the Ru precursor with hydrogen as the carrier gas. Similarly, in some embodiments, additional steps can be included.

Suitable ruthenium precursors for use in the processes of this invention can be represented by Compound (I)

    Compound (I)

wherein the ruthenium is in the +3 oxidation state;

each L is a bidentate, monoanionic ligand derived from the corresponding HL, represented by Structure (II)

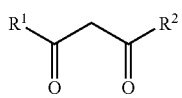
Structure (II)

wherein
R$^1$ and R$^2$ are independently chosen from the group consisting of methyl, ethyl, propyl, isopropyl, butyl, and isobutyl groups; and L* is a bidentate, monoanionic ligand derived from the group consisting of β-diketimines, N-acetimidoyl acetamidines, diacetamides and N-acetimidoylacetamidine.

Suitable L* ligands can be derived from β-diketimines represented by Structure (III):

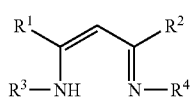
Structure (III)

wherein
R$^3$ and R$^4$ are independently selected from H, C$_1$-C$_5$ alkyl, and dimethylamino; and
R$^1$ and R$^2$ are independently selected from H and C$_1$-C$_5$ alkyl.

Suitable L* ligands can also be derived from N-acetimidoyl acetamidines represented by Structure (IV):

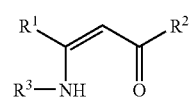
Structure (IV)

wherein
R$^3$ is independently selected from H, C$_1$-C$_5$ alkyl, and dimethylamino; and
R$^1$ and R$^2$ are independently selected from H and C$_1$-C$_5$ alkyl.

Suitable L* ligands can also be derived from diacetamides represented by Structure (V):

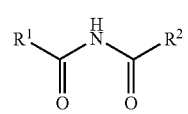
Structure (V)

wherein
R$^1$ and R$^2$ are independently selected from H and C$_1$-C$_5$ alkyl.

Suitable L* ligands can also be derived from N-acetimidoylacetamidine represented by Structure (VI):

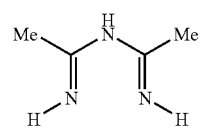
Structure (VI)

The ligands used to prepare the Ru precursors useful in the processes of this invention can be prepared as described in U.S. Pat. No. 6,939,578, which is incorporated by reference herein, or as described in *Chem. Commun.* 2001, 1174-1175 or *Inorganic Chemistry*, 2003, 42, 7239-7248.

The ruthenium(III) precursors used in this invention have been prepared from ruthenium-acetonitrile trifluoroethanesulphonate salts ([RuL$_2$(CH$_3$CN)$_2$]TFES). These ruthenium-acetonitrile trifluoroethanesulphonate salts can be prepared by procedures analogous to those described for the perchlorate salt derivative, ([RuL$_2$(CH$_3$CN)$_2$]ClO$_4$), reported by T. Kobayashi, et. al, *Chemistry Letters*, 1988, 1137-1140. Alternatively, the desired TFES salts can be prepared in a manner similar to that described for the analogous trifluoromethanesulfonate salts ([Ru(acetylacetonato)$_2$(CH$_3$CN)$_2$]CF$_3$SO$_3$), as reported by K. Oomura, D. Ooyama, Y. Satoh, N. Nagao, H. Nagao, F. S. Howell, and M. Mukaida, *Inorganic a Chimica Acta*, 1998, 269, 342-346.

$[RuL_2(CH_3CN)_2]^+$ complexes can be prepared as shown in Equations 1 and 2.

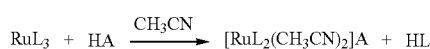 (1)

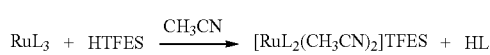 (2)

Use of trifluoroethane sulfonic acid (Eq. 2) gives novel Ru(III) complexes. Other super acids can also be used, as shown in Eq. 1, where HA is a super acid, such as trifluoromethanesulfonic acid, or perchloric acid. Weaker acids such as sulfuric and hydrochloric yield a mixture of desired product and starting material. Only strong acids ($pK_a$ less than or equal to about −8) are useful. The use of anhydrous acids is preferable to avoid the introduction of water.

The acetonitrile complex, $[RuL_2(CH_3CN)_2]^+$, is a useful starting material for the $RuL_2L^*$ complexes. Complexes in which L* is a β-diketiminate, β-ketoimidinate, or diacetamidinate are prepared by the reaction of the lithium salt of the ligand (LiL*) with the anhydrous $[RuL_2(CH_3CN)]^+$ salt in a solvent such as toluene. The reaction is shown in Equation 3 for the TFES salt. These products are often oils or low melting solids.

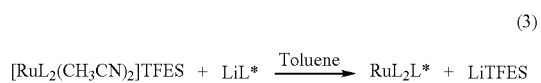 (3)

Ru complexes with L*=N-acetimidoylacetamidine are prepared by the reactions shown in Equations 4 and 5, where HA is a strong acid such as perchloric acid, triflic acid, tetrafluorethanesulfonic acid, 1,1,2,3,3,3,3-hexafluoro-1-propanesulfonic acid, or 1-butanesulfonic acid.

 (4)

 (5)

The reaction of the acetonitrile complex with excess ammonina under anhydrous conditions produces a Ru complex with L*=N-acetimidoylacetamidine.

EXAMPLES

The present invention is further defined in the following Examples. All reagents are available from Sigma-Aldrich Corporation (Milwaukee, Wis., USA) or Acros Organics (Morris Plains, N.J.). Standard dry box and Schlenk-ware techniques were used in the preparation and handling of the compounds described below. Organic solvents were deaerated with nitrogen and dried over activated 4 Å sieves. Elemental analyses were performed by Micro-Analysis, Inc., Wilmington, Del. 19808.

Example 1

This Example demonstrates the preparation of bis(acetonitrile)bis(2,2,6,6-tetramethylheptanedionato)ruthenium(III) tetrafluoroethanesulfonate, $([RuL_2(CH_3CN)_2]TFES)$.

In a Vacuum Atmospheres dry box under a nitrogen atmosphere, tris(2,2,6,6-tetramethyl-3,5-heptanedinato)ruthenium(III) (2.00 g) was dissolved in 50 mL acetonitrile. Tetrafluoroethanesulfonic acid (0.687 g) was dissolved in 2-3 mL acetonitrile and added in portions over 5-10 min to a stirred solution of the ruthenium complex in acetonitrile. A deep purple color developed immediately. The solution was stirred for one hour at room temperature. The solvent volume was reduced to 5-10 mL under vacuum. The dark blue solution was removed from the dry box, dissolved in 100 mL dichloromethane, and extracted three times with 100 mL ion chromatography grade water. The organic layer was then dried over anhydrous magnesium sulfate and filtered. The solvents were removed on a rotary evaporator. The dark solid was returned to the dry box, dissolved in 50 mL acetonitrile, and extracted three times with 50 mL hexanes to remove unreacted starting Ru(III) compound (tris(2,2,6,6-tetramethyl-3,5-heptanedinato)ruthenium(III). The acetonitrile layer was then dried over activated 4 Å sieves overnight. The solvent was removed under vacuum to yield a dark blue solid in 88% yield. Analyses are consistent with the formation of $[Ru(C_{11}H_{19}O_2)_2(CH_3CN)_2](C_2F_4HSO_3)$. The observed composition was 46.16% C, 6.23% H and 3.62% N. Infrared spectrum in a Nujol mull shows stretches at 2326 and 2297 $cm^{-1}$ ($CH_3CN$ stretch), 1532, 1519, and 1501 $cm^{-1}$ (C=O stretch), and 1226 $cm^{-1}$ (S—O stretch).

Example 2

This Example demonstrates the preparation of (N-acetimidoylacetamidinato)bis(2,2,6,6-tetramethylheptanedionato)ruthenium(III), $[RuL_2(C_4H_8N_3)]$.

In the dry box, 1.50 g of $[Ru(2,2,6,6$-tetramethylheptanedionato$)_2(CH_3CN)_2]TFES$ prepared as in Example 1 was dissolved in approximately 25 mL acetonitrile. To this solution was added an ammonia solution in methanol (4 mL of a 2.0 M solution). The mixture was stirred for four days at room temperature. During this time, the solution color changed from bluish purple to reddish purple. Solvent was removed under vacuum to yield a dry, reddish-purple solid, $[Ru(C_{11}H_{19}O_2)_2(C_4H_9N_3)]TFES$. Infrared spectrum in a Nujol mull shows stretches at 3437, 3264, and 3211 $cm^{-1}$ (N—H stretch), 1654 $cm^{-1}$ (C=N stretch), 1583, 1530, and 1499 $cm^{-1}$ (C=O stretch) and 1248 $cm^{-1}$ (S—O stretch). To 1.00 g of this product in 25 mL of acetonitrile was added sodium methoxide (0.076 g) as a powder. The reaction mixture was stirred at room temperature for 0.5 hr. The solvent was removed under vacuum to yield a dark solid. This material was extracted with hexanes, and filtered through Celite® 545 to yield a yellow-brown solution. Removal of solvent yielded a yellow-brown powder. Sublimation of this material at 130-135° C. at 50-100 mtorr gave a yellow solid. Analyses are consistent with the formation of $Ru(C_{11}H_{19}O_2)_2(C_4H_8N_3)$. The observed composition was 54.96% C, 7.93% H and 7.14% N. Infrared spectrum in a Nujol mull shows stretches at 1576 $cm^{-1}$ (C=N stretch), and 1540, 1522, and 1490 $cm^{-1}$ (C=O stretch).

Example 3

This Example demonstrates the preparation of N,N'-diethylpentanediketimato)bis(2,2,6,6-tetramethylheptanedionato)ruthenium(III), $[RuL_2(C_9H_{17}N_2)]$.

All manipulations were performed in a Vacuum Atmosphere dry box under nitrogen. $[Ru(2,2,6,6$-tetramethylheptanedionato$)_2(CH_3CN)_2]TFES$, (0.140 g) prepared as described in Example 1 was dissolved in approximately 10 mL acetonitrile in a 20-mL screw-top vial. A Teflon®-coated stir bar was added. 0.0295 g Li (N,N'-diethylpentanediketiminate), prepared by the reaction of the free ligand and t-butyl lithium in ether (US 2005/0227007), was added all at once as a dry powder. Within minutes, the solution color changed from a bluish purple to red. The mixture was stirred at room temperature for 0.5 hr. The solvent was removed under vacuum. The residues were extracted with hexanes. Filtration yielded a red solution. Solvent was removed under vacuum to yield a red oil.

Example 4

This Example demonstrates the preparation of ethylaminopentanato)bis(2,2,6,6-tetramethylheptanedionato)ruthenium(III), [Ru($C_{11}H_{19}O_2$)$_2$($C_5H_8NO$)].

All manipulations were performed in a Vacuum Atmosphere dry box under nitrogen. [Ru(2,2,6,6-tetramethylheptanedionato)$_2$($CH_3CN$)$_2$]TFES prepared as described in Example 1 (0.152 g) was dissolved in approximately 10 mL acetonitrile in a 20-mL screw-top vial. A Teflon®-coated stir bar was added. 0.0252 g Na (3-amino-5-pentanone), prepared by the reaction of the free ligand with sodium methoxide in ethanol followed by removal of solvent, was added all at once as a dry powder. Within minutes, the solution color changed from a bluish purple to red. The mixture was stirred at room temperature for 0.5 hr. The solvent was removed under vacuum. The residues were extracted with hexanes. Filtration yielded a red solution. Solvent was removed under vacuum to yield a red oil.

Example 5

This Example demonstrates the preparation of bis(acetonitrile)bis(acetylacetonate)ruthenium(III) tetrafluoroethanesulfonate, ([Ru(acac)$_2$($CH_3CN$)$_2$]TFES).

In a Vacuum Atmospheres dry box under a nitrogen atmosphere, tris(acetylacetonate)ruthenium(III) (2.00 g) was dissolved in 50 mL acetonitrile. Tetrafluoroethanesulfonic acid (1.147 g) was dissolved in 10 mL acetonitrile and added in portions over 5-10 min to the stirred acetonitrile solution with the ruthenium complex. A deep purple color developed immediately. The solution was stirred for one hr at room temperature. The solvent volume was reduced to 5-10 mL under vacuum. The dark blue solution was removed from the dry box, dissolved in 100 mL dichloromethane, and extracted three times with 100 mL ion chromatography grade water. The organic layer was then dried over anhydrous magnesium sulfate and filtered. The solvents were removed on a rotary evaporator. The dark solid was returned to the dry box, dissolved in 50 mL acetonitrile, and dried over activated 4 Å sieves overnight. The solvent was removed under vacuum to yield a dark blue solid. Analyses are consistent with the formation of [Ru($C_5H_7O_2$)$_2$($CH_3CN$)$_2$]($C_2F_4HSO_3$). The observed composition was 34.48% C, 3.22% H, and 4.65% N. Infrared spectrum in a Nujol mull shows stretches at 2323 and 2295 cm$^{-1}$ ($CH_3CN$ stretch), 1525 cm$^{-1}$ (C=O stretch), and 1224 cm$^{-1}$ (S—O stretch).

What is claimed is:

1. An atomic layer deposition process for depositing an oxide-free ruthenium-containing film on a surface of a substrate, comprising:
    a. exposing the surface to a surface-activating agent to form a deposit of a surface-activating complex on the surface, wherein the surface-activating agent is selected from the group consisting of formic acid, carboxylic acids, piperidines, and nitrogen-containing aromatic heterocycles;
    b. exposing the deposit of the surface-activating complex to a ruthenium precursor to form a deposited ruthenium complex on the surface; and
    c. reacting the deposited ruthenium complex with a reducing agent to form a ruthenium-containing film on the surface.

2. The process of claim 1, wherein the reducing agent is selected from the group consisting of hydrogen, disilane, 9-borabicyclon[3.3.1]nonane, borane, dihydrobenzofuran, pyrazoline, diethylsilane, dimethylsilane, ethylsilane, methylsilane, phenylsilane, and silane.

3. The process of claim 1, wherein the nitrogen-containing aromatic heterocycle is selected from the group consisting of pyrazoles, imidazoles and triazoles.

4. The process of claim 1, wherein the substrate comprises copper, silicon dioxide, silicon, a low k substrate, or a low k substrate coated with a barrier layer.

5. The process of claim 4, wherein the barrier layer is selected from the group consisting of tantalum, tantalum nitride, titanium, titanium nitride, tantalum silicon nitride, titanium silicon nitride, tantalum carbon nitride, tungsten carbonitride, and niobium nitride.

6. The process of claim 1, wherein the ruthenium precursor is a compound represented by formula (I)

$$RuL_2L^* \qquad (I)$$

wherein the ruthenium is in the +3 oxidation state;
each L is a bidentate, monoanionic ligand derived from HL, and HL is represented by structure (II)

wherein
$R^1$ and $R^2$ are independently selected from methyl, ethyl, propyl, isopropyl, butyl, and isobutyl groups; and
L* is a bidentate, monoanionic ligand derived from HL*, wherein HL* is selected from the group consisting of □-diketimines, N-acetamidoyl acetamidines, diacetamides, and N-acetimidoylacetamidine.

7. The process of claim 6, wherein HL* is a □-diketimine represented by structure (III)

wherein
$R^3$ and $R^4$ are independently selected from H, $C_1$-$C_5$ alkyl, and dimethylamino;
$R^1$ and $R^2$ are independently selected from H and $C_1$-$C_5$ alkyl.

8. The process of claim 6, wherein HL* is an N-acetamidoyl acetamidine represented by structure (IV)

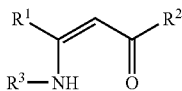

Structure (IV)

wherein
- R³ is independently selected from H, $C_1$-$C_5$ alkyl, and dimethylamino; and
- R¹ and R² are independently selected from H and $C_1$-$C_5$ alkyl.

9. The process of claim 6, wherein HL* is a diacetamide represented by structure (V)

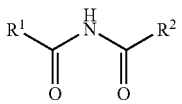

Structure (V)

wherein
R¹ and R² are independently selected from H and $C_1$-$C_5$ alkyl.

10. The process of claim 6, wherein HL* is an N-acetimidoylacetamidine represented by structure (VI):

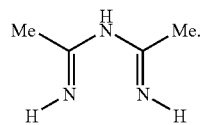

(VI)

* * * * *

UNITED STATES PATENT AND TRADEMARK OFFICE
CERTIFICATE OF CORRECTION

PATENT NO. : 7,632,351 B2                                     Page 1 of 1
APPLICATION NO. : 11/497858
DATED           : December 15, 2009
INVENTOR(S)     : Jeffery Scott Thompson It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 479 days.

Signed and Sealed this

Second Day of November, 2010

David J. Kappos
*Director of the United States Patent and Trademark Office*